(12) United States Patent
Delfosse et al.

(10) Patent No.: US 12,333,387 B2
(45) Date of Patent: *Jun. 17, 2025

(54) LOGICAL QUBIT ENCODING SURFACE

(71) Applicant: Microsoft Technology Licensing, LLC, Redmond, WA (US)

(72) Inventors: Nicolas Guillaume Delfosse, Bellevue, WA (US); Michael Edward Beverland, Seattle, WA (US); Jeongwan Haah, Bellevue, WA (US); Rui Chao, Los Angeles, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 96 days.

This patent is subject to a terminal disclaimer.

(21) Appl. No.: 18/174,616

(22) Filed: Feb. 25, 2023

(65) Prior Publication Data

US 2024/0370752 A1 Nov. 7, 2024

Related U.S. Application Data

(63) Continuation of application No. 16/657,922, filed on Oct. 18, 2019, now Pat. No. 11,599,817.

(51) Int. Cl.
*G06N 10/00* (2022.01)
*G06N 10/20* (2022.01)
*G06N 10/70* (2022.01)
*H03M 13/00* (2006.01)

(52) U.S. Cl.
CPC ............. *G06N 10/70* (2022.01); *G06N 10/20* (2022.01); *H03M 13/611* (2013.01); *H03M 13/6575* (2013.01)

(58) Field of Classification Search
CPC ..... G06N 10/00; G06N 10/70; H03M 13/611; H03M 13/6575
See application file for complete search history.

(56) References Cited

U.S. PATENT DOCUMENTS 11,599,817 B2 * 3/2023 Delfosse ............... G06N 10/70
2019/0044543 A1 2/2019 Chamberland

FOREIGN PATENT DOCUMENTS

CN 109196529 A 1/2019

OTHER PUBLICATIONS

Cai, et al., "A Silicon Surface Code Architecture Resilient Against Leakage Errors" arXiv: 1904.10378v1, Apr. 23, 2019, pp. 1-19.
First Office Action Received for Chinese Application No. 202080072654.9, mailed on Dec. 31, 2024, 18 Pages (English Translation Provided).

* cited by examiner

*Primary Examiner* — Samir W Rizk
(74) *Attorney, Agent, or Firm* — Alleman Hall & Tuttle LLP

(57) ABSTRACT

A quantum computing device is provided, including a logical qubit encoding surface including a plurality of plaquettes. Each plaquette of the plurality of plaquettes may include a plurality of measurement-based qubits. The plurality of measurement-based qubits may include four data qubits and a first ancilla qubit. The first ancilla qubit may be electrically connected to the four data qubits and a second ancilla qubit included in the logical qubit encoding surface.

20 Claims, 12 Drawing Sheets

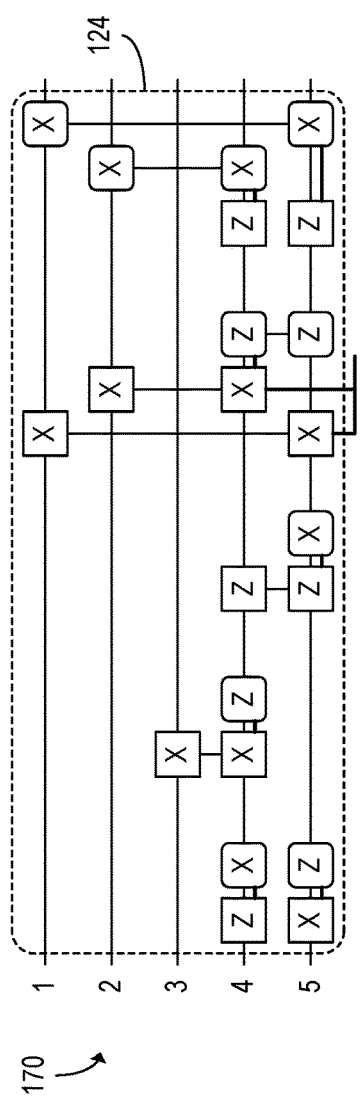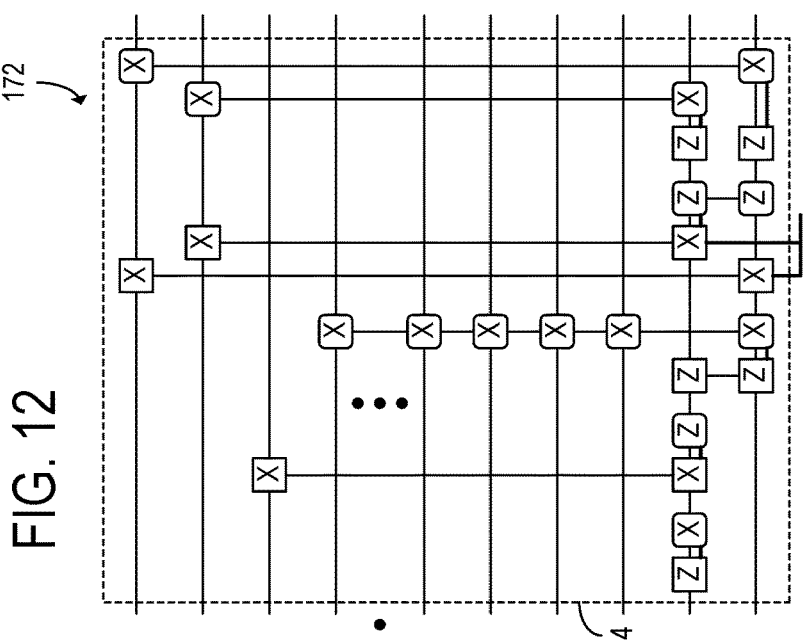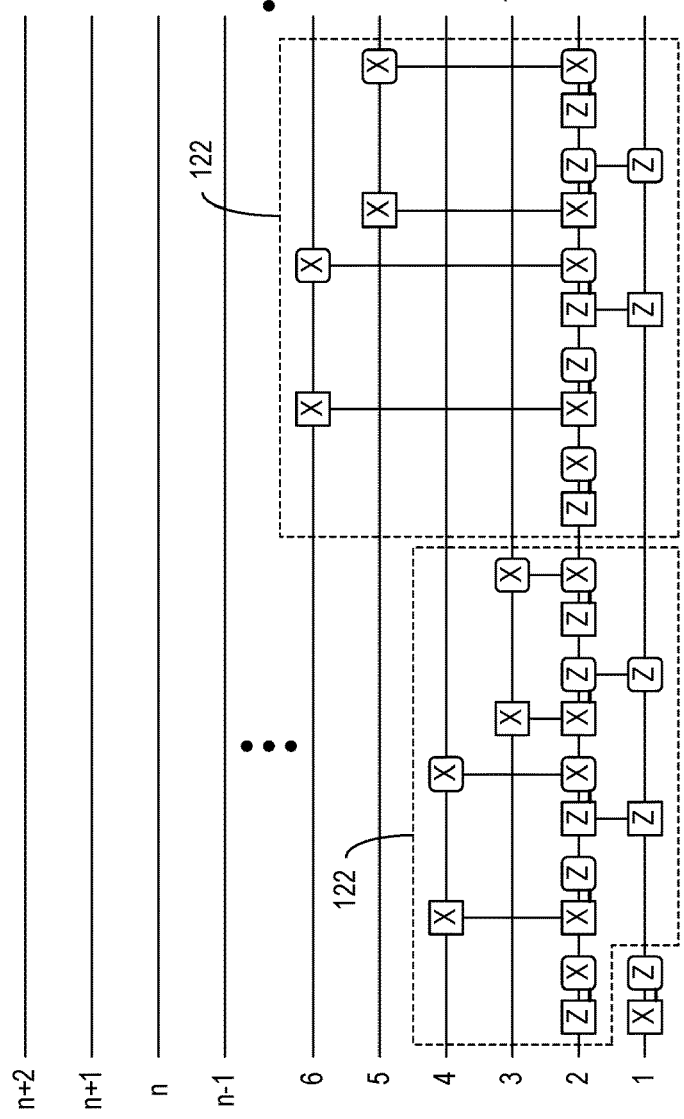
FIG. 11
FIG. 12

LOGICAL QUBIT ENCODING SURFACE

CROSS REFERENCE TO RELATED APPLICATIONS

This application is a continuation of U.S. patent application Ser. No. 16/657,922, filed Oct. 18, 2019, the entirety of which is hereby incorporated herein by reference for all purposes.

BACKGROUND

Errors frequently occur when performing computations with a quantum computing device. In order for the results of such computations to be accurate, the errors typically have to be corrected at a faster rate than the rate at which they occur.

The error rate for quantum computations depends on structural properties of the quantum computing device. For example, increasing the number of physical qubits used to implement a logical qubit may increase the error rate. The error rate of a physical qubit may also increase as the connectivity degree of the physical qubit (the number of other physical qubits to which the physical qubit is connected) increases.

The architecture of a quantum computing device also affects what error correction methods may be used. Accordingly, it is beneficial for a quantum computing device to have a structure that both has a low error rate and allows efficient methods of error correction to be used.

SUMMARY

According to one aspect of the present disclosure, a quantum computing device is provided, including a logical qubit encoding surface including a plurality of plaquettes. Each plaquette of the plurality of plaquettes may include a plurality of measurement-based qubits. The plurality of measurement-based qubits may include four data qubits and a first ancilla qubit. The first ancilla qubit may be electrically connected to the four data qubits and a second ancilla qubit included in the logical qubit encoding surface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 11 shows an example measurement sequence that may be used to measure a Pauli XXX operator, according to the embodiment of FIG. 2.

FIG. 12 shows an example measurement sequence with which a plurality of two-qubit CNOT gates may be measured, according to the embodiment of FIG. 2.

DETAILED DESCRIPTION

Surface code error correction is one existing method of error correction that has been developed for use in quantum computing devices. Surface code error correction may be used in quantum computing devices that include physical qubits that have controlled not (CNOT) gates and are arranged in a substantially planar layout. Surface codes may allow error correction to be performed for physical qubits that have high error rates. In addition, surface codes may be implemented entirely with single-qubit gates and nearest-neighbor operations.

Figure 1A:
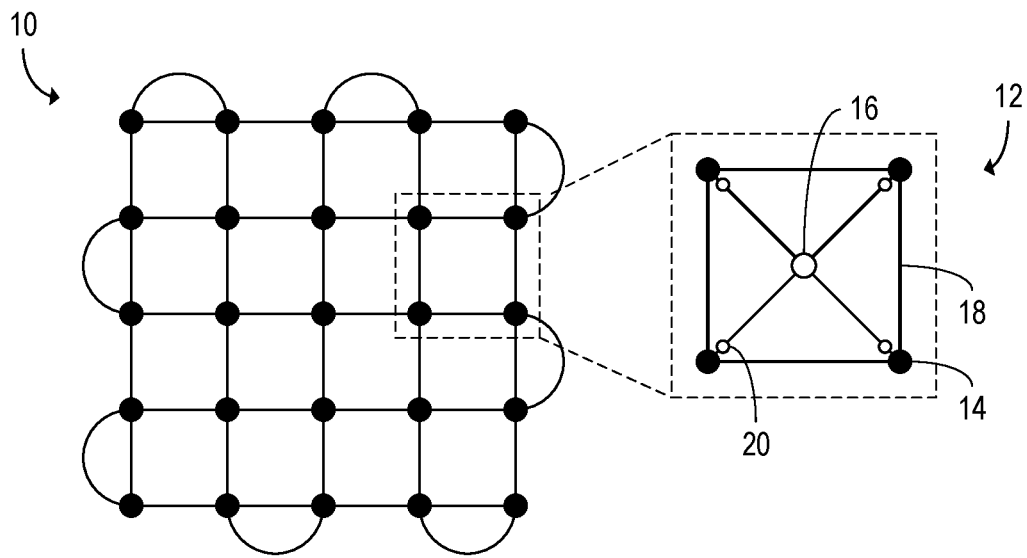
FIGS. 1A-1B show an example logical qubit encoding surface including a plurality of CNOT-based qubits, including a 5×5 grid of data qubits.

FIG. 1A shows an example conventional logical qubit encoding surface 10 at which a surface code may be used. Each physical qubit included in the logical qubit encoding surface 10 of FIG. 1A is a CNOT-based qubit. The logical qubit encoding surface 10 of FIG. 1A includes a plurality of plaquettes 12 that each include four data qubits 14. Each data qubit 14 may be electrically connected to its vertical and horizontal neighbors to form a rectangular grid. As shown in FIG. 1A, the plurality of data qubits 14 included in the logical qubit encoding surface 10 may form a square grid. In addition, the data qubits 14 included in each plaquette 12 may be arranged in a square shape.

Figure 1B:
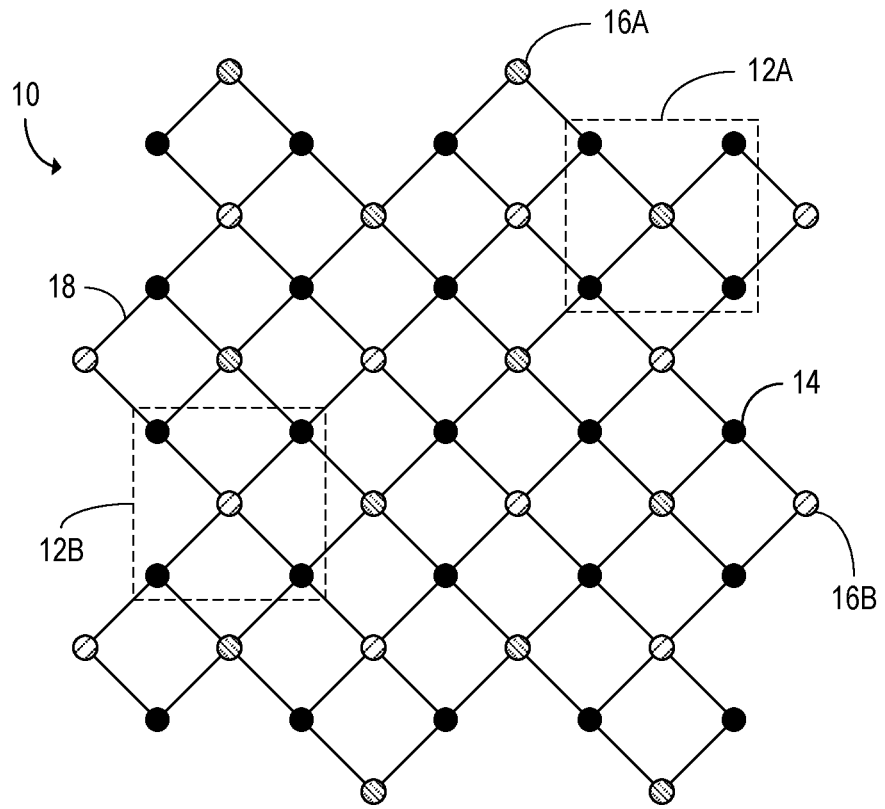

Each plaquette 12 may further include an ancilla qubit 16, which may be electrically coupled to each of the four data qubits 14 included in the plaquette 12. Each of the electrical connections 18 between a data qubit 14 and an ancilla qubit 16 shown in FIG. 1A includes a CNOT gate 20. In addition, a plurality of ancilla qubits 16 may be located outside the edges of the rectangular grid formed by the plurality of data qubits 14. Such ancilla qubits 16 may be electrically connected to pairs of data qubits 14 such that each data qubit 14 located at an edge of the rectangular grid is connected to one ancilla qubit 16 located outside the edges of the rectangular grid. FIG. 1B shows the conventional logical qubit encoding surface 10 of FIG. 1A including the plurality of ancilla qubits 16.

When surface code error correction is performed, stabilizer operators XXXX and ZZZZ may be measured at the ancilla qubits 16 of the logical qubit encoding surface 10. The XXXX stabilizer operator includes an Pauli X operator applied to each of the data qubits 14 of a plaquette 12, and the ZZZZ stabilizer operator includes a Pauli Z operator applied to each of the data qubits 14 of a plaquette 12. The XXXX stabilizer operator and the ZZZZ stabilizer operator may be measured at ancilla qubits 16 having alternating positions in the rectangular grid. FIG. 1B shows a plurality of XXXX ancilla qubits 16A that alternate with a plurality of ZZZZ ancilla qubits 16B. Thus, the logical qubit encoding surface 10 may include a plurality of XXXX plaquettes 12A, each of which includes an XXXX ancilla qubit 16A, and a plurality of ZZZZ plaquettes 12B, each of which includes a ZZZZ ancilla qubit 16B. In addition, XX stabilizer operators and ZZ stabilizer operators may be respectively measured at the ancilla qubits 16A and 16B that are located outside the edges of the rectangular grid and are each connected to only two data qubits 14.

The respective measurement of each stabilizer operator may output one bit, known as a syndrome bit. Thus, a plurality of syndrome bits may be measured for different locations on the logical qubit encoding surface. The plurality of syndrome bits may be conveyed to a classical computing device, at which a decoder may determine, based on the plurality of syndrome bits, a location on the logical qubit encoding surface at which an error has occurred.

In the example of FIGS. 1A-1B, for each data qubit 14 included in a plaquette 12, a respective CNOT gate 20 is applied to that data qubit 14 is applied to that data qubit 14 along the electrical connection 18 between that data qubit 14 and the ancilla qubit 16 of the plaquette 12. The CNOT gate 20 entangles the data qubit 14 and the ancilla qubit 16 such that the measurement performed on the ancilla qubit 16 is a joint measurement of the data qubit 14 and the ancilla qubit 16.

Measurement-based qubits are physical qubits for which the available measurements are one-qubit and two-qubit measurements of the X, Y, and Z Pauli operators. A measurement-based qubit may, for example, be constructed from a plurality of Majorana zero modes (MZMs). A Pauli operator of the measurement-based qubit may be measured by measuring a joint fermionic parity of a proper set of the plurality of the MZMs. Such measurements of Pauli operators may be topologically protected, thereby reducing the error rate of the measurements.

Although measurement-based qubits do not have native CNOT gates, a CNOT gate may be constructed from a plurality of Pauli measurements, as discussed in further detail below. However, if measurement-based qubits were used in place of the CNOT-based data qubits 14 in the configuration shown in FIGS. 1A-1B, the resulting logical qubit encoding surface 10 would include too few ancilla qubits 16 for surface code error correction to be used.

In order to form CNOT gates 20 when measurement-based qubits are used, an additional ancilla qubit 16 may be added along each of the electrical connections 18 of the logical qubit encoding surface 10 shown in FIG. 1B. However, such a configuration would include 104 ancilla qubits 16, whereas the configuration of FIG. 1B includes only 24 ancilla qubits 16. This increase in the number of ancilla qubits 16 would significantly increase the error rate and the cost of manufacturing the logical qubit encoding surface 10.

Figure 2:
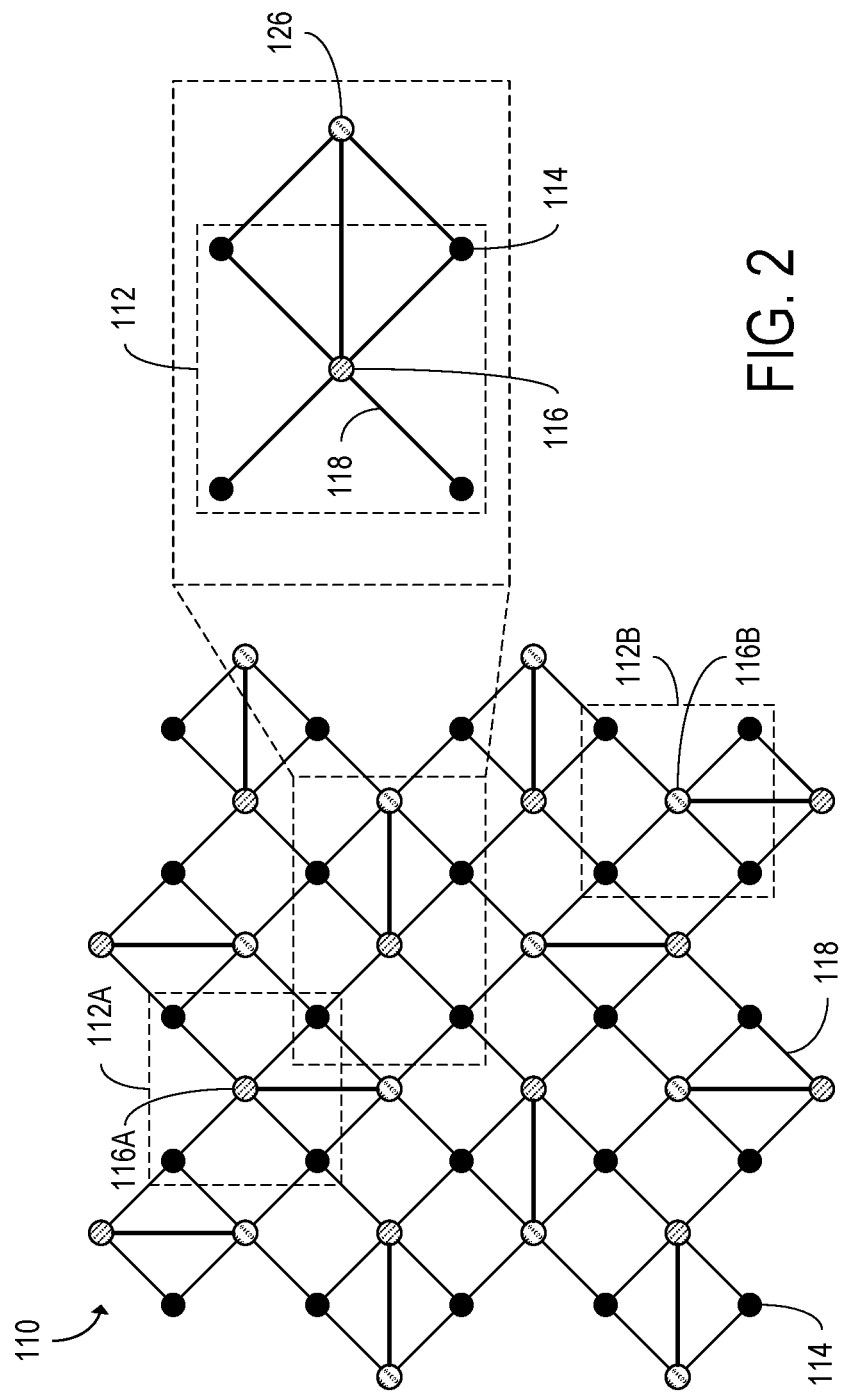
FIG. 2 shows an example logical qubit encoding surface including a plurality of measurement-based qubits, including a 5×5 grid of data qubits.

To address these issues associated with the conventional logical qubit encoding surface 10 of FIGS. 1A and 1B, as an alternative to a configuration in which an additional ancilla qubit 16 is included for each CNOT gate 20, a logical qubit encoding surface 110 according to the present disclosure is shown in FIG. 2. The logical qubit encoding surface 110 of FIG. 2 includes a plurality of plaquettes 112. Each plaquette 112 of the plurality of plaquettes 112 includes a plurality of measurement-based qubits, including four data qubits 114 and a first ancilla qubit 116. The first ancilla qubit 116 may be electrically connected to the four data qubits 114. In contrast to the electrical connections 18 shown in FIGS. 1A-1B, the electrical connections 118 shown in FIG. 2 do not include native CNOT gates 20.

In some embodiments, as shown in the example of FIG. 2, the four data qubits 114 of the plaquette 112 may be arranged in a square. In such embodiments, the first ancilla qubit 116 may be located within the square. The respective data qubits 114 included in the plurality of plaquettes 112 may also be arranged in a rectangular grid. In the example of FIG. 2, the rectangular grid is a 5×5 square grid.

The first ancilla qubit 116 may be electrically connected to a second ancilla qubit 126. The second ancilla qubit 126 may be included in the logical qubit encoding surface 110 outside the plaquette 112 in which the first ancilla qubit 116 is located. The second ancilla qubit 126 may also be electrically connected to two of the four data qubits 114 of the plaquette 112. For example, the second ancilla qubit 126 may be included in a neighboring plaquette 112. Alternatively, in embodiments in which the plurality of data qubits 114 form a rectangular grid, the second ancilla qubit 126 may be located outside an edge of the rectangular grid.

In embodiments in which the plurality of data qubits 114 form a rectangular grid, the electrical connections 118 between first ancilla qubits 116 and second ancilla qubits 126 may form a "windmill" pattern centered around the middle of the rectangular grid. In such embodiments, for each plaquette 112 of the plurality of plaquettes 112, the electrical connection 118 between the first ancilla qubit 116 and the second ancilla qubit 126 may extend in a direction perpendicular to the edge of the rectangular grid that is closest to a midpoint between the first ancilla qubit 116 and the second ancilla qubit 126.

The logical qubit encoding surface 110 of FIG. 2 includes a total of 24 ancilla qubits. The configuration of FIG. 2 therefore allows measurement-based qubits to be used in place of CNOT-based qubits without increasing the total number of ancilla qubits included in the logical qubit encoding surface 110 relative to the logical qubit encoding surface 10 of FIGS. 1A-1B.

Figure 3:
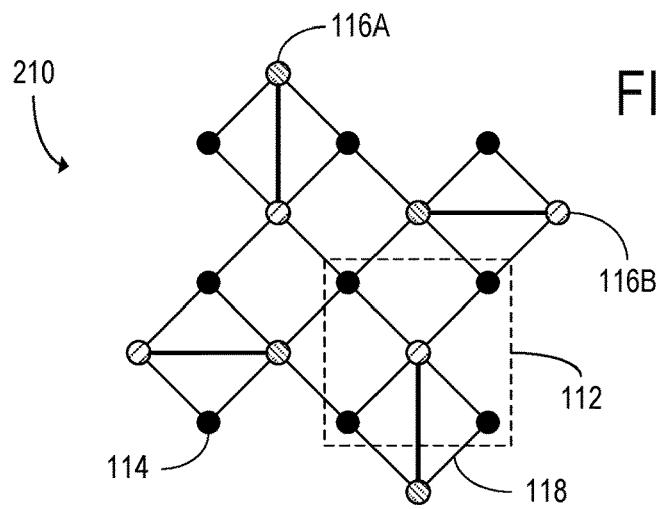
FIG. 3 shows an example logical qubit encoding surface including a plurality of measurement-based qubits, including a 3×3 grid of data qubits.
Figure 4:
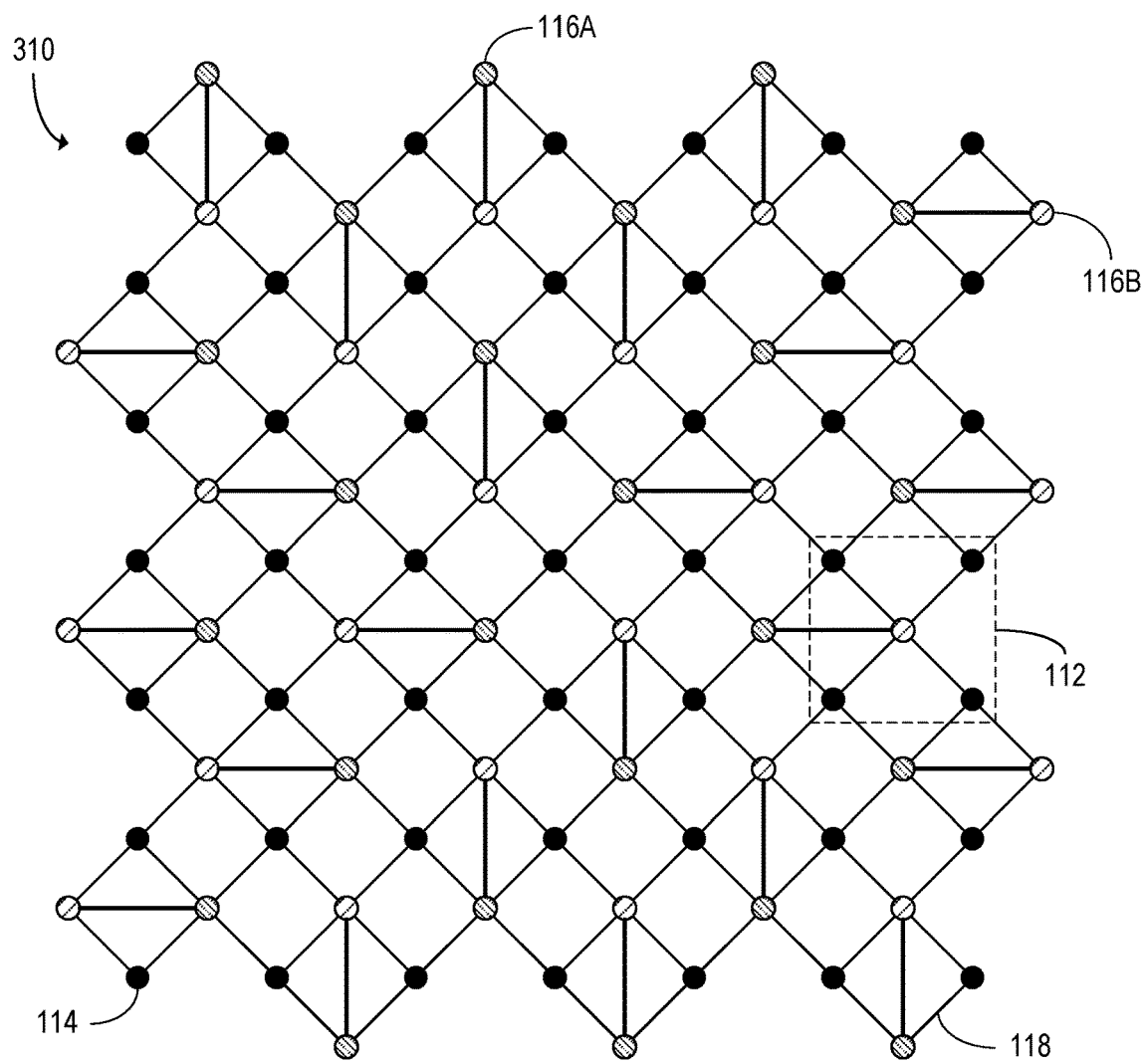
FIG. 4 shows an example logical qubit encoding surface including a plurality of measurement-based qubits, including a 7×7 grid of data qubits.

FIG. 3 shows another example logical qubit encoding surface 210 that includes a 3×3 square grid of data qubits 114. In the example of FIG. 3, the logical qubit encoding surface 210 includes four plaquettes 112 and eight ancilla qubits. In addition, FIG. 4 shows another example logical qubit encoding surface 310 that includes a 7×7 square grid of data qubits 114. The logical qubit encoding surface 310 of FIG. 4 includes 36 plaquettes 112 and 48 ancilla qubits. The logical qubit encoding surface 210 of FIG. 3 and the logical qubit encoding surface 310 of FIG. 4 each include the same total number of ancilla qubits as would be included in 3×3 and 7×7 versions of the CNOT-based logical qubit encoding surface 10 of FIGS. 1A-1B.

Figure 5:
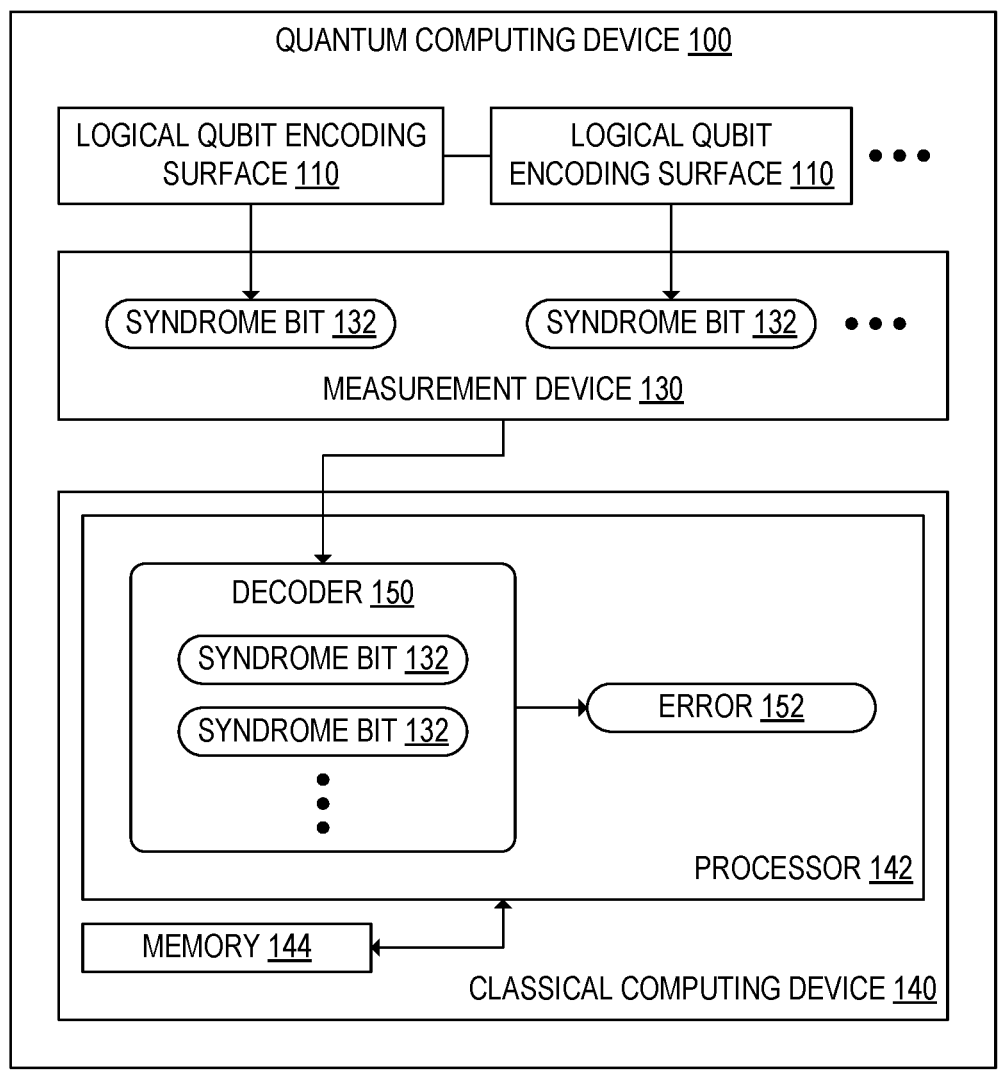
FIG. 5 schematically shows an example quantum computing device, according to the embodiment of FIG. 2.

Turning now to FIG. 5, a quantum computing device 100 is schematically depicted. As shown in FIG. 5, the quantum computing device 100 may include one or more logical qubit encoding surfaces 110 with which quantum computations may be performed. Although the quantum computing device 100 depicted in FIG. 5 includes one or more copies of the logical qubit encoding surface 110 of FIG. 2, the quantum computing device 100 may alternatively include one or more copies of the logical qubit encoding surface 210 of FIG. 3, the logical qubit encoding surface 310 of FIG. 4, or a logical qubit encoding surface with some other configuration.

The quantum computing device 100 of FIG. 5 may further include a measurement device 130. The measurement device 130 may, for example, be a circuit that is electrically connected to the logical qubit encoding surface 110. For each measurement qubit encoding surface 110, the measurement device 130 may be configured to perform a measurement of a logical qubit encoded by that logical qubit encoding surface 110. In addition, the measurement device 130 may be further configured to measure a respective stabilizer operator of each plaquette 112 included in the logical qubit encoding surface 110, as discussed in further detail below. Each measurement of the stabilizer operator of a plaquette 112 may result in one bit, known as a syndrome bit 132.

The quantum computing device 100 may further include a classical computing device 140, as shown in the example of FIG. 5. The classical computing device 140 may include a processor 142 and memory 144, which may be communicatively coupled. In some embodiments, the classical computing device may further include one or more input devices, one or more output devices, and/or one or more communication devices. In some embodiments, the functions of the classical computing device 140 may be distributed across a plurality of physical computing devices that are communicatively coupled via their respective communication devices.

The classical computing device 140 may be configured to receive the one or more syndrome bits 132 from the measurement device 130. The one or more syndrome bits 132 may be received at a decoder 150 executed by the processor 142 of the classical computing device 140. At the decoder 150, the processor 142 may be configured to identify an error 152 in the measurement of the logical qubit based on the one or more syndrome bits 132 obtained as respective measurement results of the stabilizer operators. For example, the decoder 150 may identify the error 152 based on the one or more syndrome bits 132 using the union-find decoding algorithm. Since the union-find decoding algorithm is almost linear in complexity as a function of the number of physical qubits, the union-find algorithm may allow the classical computing device 140 to efficiently identify the error 152.

As discussed above, for each plaquette 112 for which the stabilizer operator is measured, the stabilizer operator may be a product of four Pauli X operators or four Pauli Z operators of the four respective data qubits 114 included in the plaquette 112. When measuring the stabilizer operators of the plaquettes 112 included in the logical qubit encoding surface 110, the measurement device 130 may be configured to alternate between measuring the XXXX stabilizer operator and the ZZZZ stabilizer operator. Returning to FIG. 2, the measurement device 130 may be configured to measure the product of the four Pauli X operators for each of a first set of plaquettes 112A and the product of the four Pauli Z operators for each of a second set of plaquettes 112B. In the example of FIG. 2, each plaquette 112A included in the first set of plaquettes 112A includes an XXXX ancilla qubit 116A. In addition, each plaquette 112B included in the second set of plaquettes 112B includes a ZZZZ ancilla qubit 116B.

Figure 6:
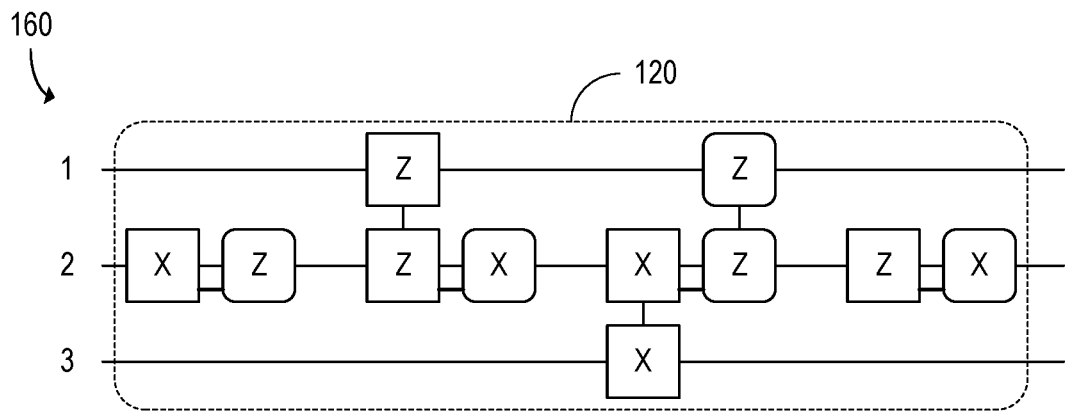
FIG. 6 shows an example measurement sequence with which a controlled not (CNOT) gate may be implemented, according to the embodiment of FIG. 2.

Measuring a stabilizer operator at the logical qubit encoding surface 110 may include applying a CNOT gate to at least one ancilla qubit. Although measurement-based qubits do not have native CNOT operations, a CNOT gate may be constructed using a sequence of Pauli operator measurements. Turning now to FIG. 6, a measurement sequence 160 with which a one-target CNOT gate 120 may be implemented using measurement-based qubits is shown. The measurement sequence 160 of FIG. 6 is performed with a first qubit 1 that is used as a control qubit, a second qubit 2 that is used as an ancilla qubit, and a third qubit 3 that is used as a target qubit. When an XXXX stabilizer operator is measured for a plaquette 112, the two ancilla qubits used in the measurement may correspond to the first qubit 1 and the second qubit 2 shown in FIG. 6, and when a ZZZZ stabilizer operator is measured, the two ancilla qubits used in the measurement may correspond to the second qubit 2 and the third qubit 3.

In some embodiments, the third qubit 3 may be the second ancilla qubit 126 of the plaquette 112. In such embodiments, applying the CNOT gate 120 may include performing a plurality of first ancilla measurements of at least the first ancilla qubit 116. Each first ancilla measurement may be a one-qubit measurement or a two-qubit measurement.

The measurement sequence 160 shown in FIG. 6 includes a plurality of measurements of Pauli X operators and Pauli Z operators, each of which are depicted as squares in FIG. 6. Each measurement may be a single-qubit measurement or a two-qubit measurement. The measurement sequence 160 shown in FIG. 6 also includes a plurality of Pauli updates, which are shown as rounded squares. Each Pauli update may apply a Pauli operator to a qubit or a pair of qubits under the condition that the preceding measurement had a nontrivial outcome. A nontrivial outcome is defined in the example of FIG. 6 as a measurement outcome of $|-\rangle$, which is returned when an error 152 has occurred. In the example of FIG. 6, each Pauli update applies a Pauli X operator or a Pauli Z operator. In embodiments in which the third qubit 3 is the second ancilla qubit 126, implementing the CNOT gate 120 may include, for each first ancilla measurement, performing a Pauli update on at least the first ancilla qubit 126 subsequently to the first ancilla measurement.

Figure 7:
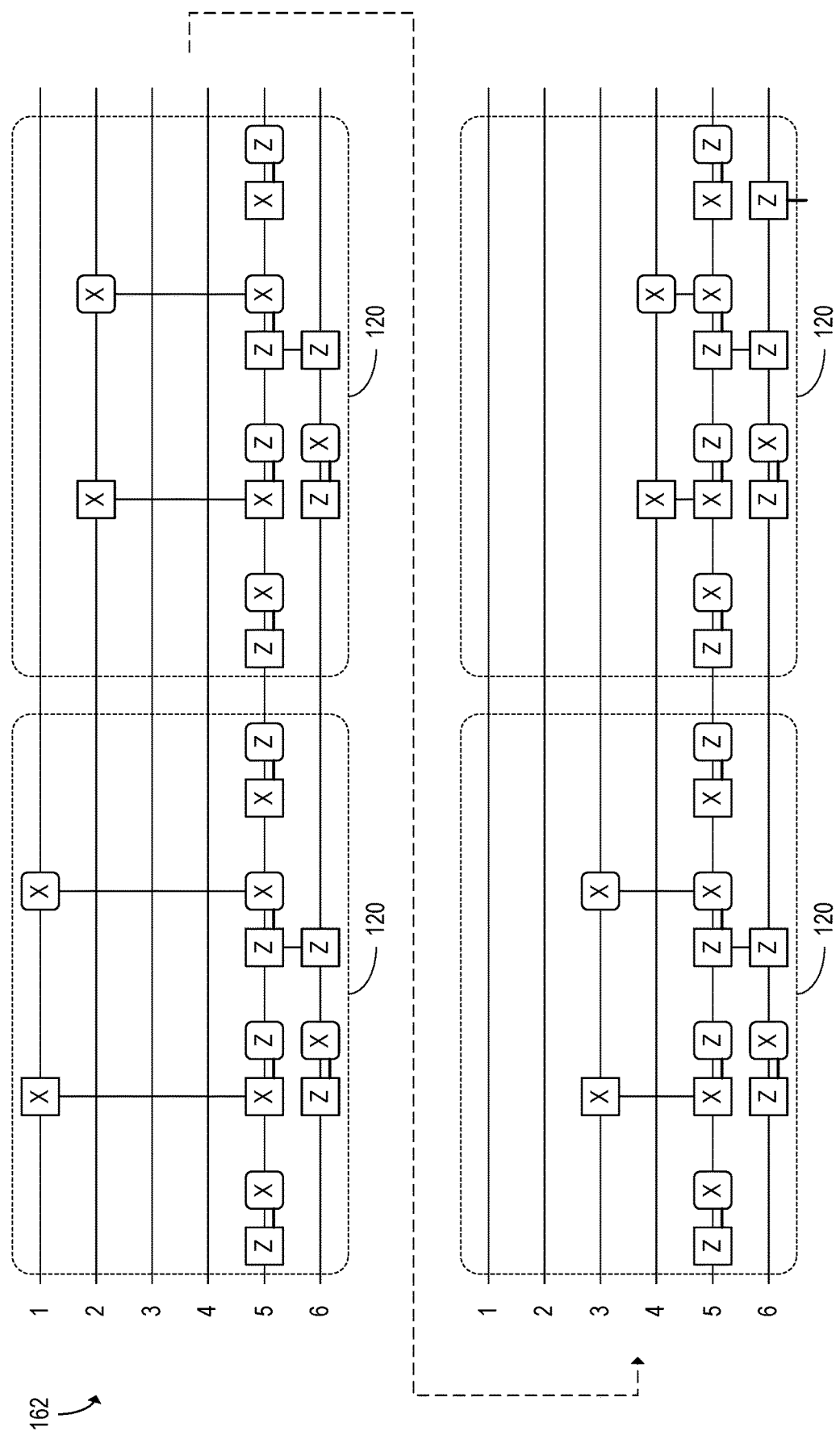
FIG. 7 shows a stabilizer operator measurement sequence that may be used to measure an XXXX stabilizer operator, according to the embodiment of FIG. 2.

FIG. 7 shows a stabilizer operator measurement sequence 162 that may be used to measure an XXXX stabilizer operator at a plaquette 112. The physical qubits of the plaquette 112 are labeled as a first qubit 1, a second qubit 2, a third qubit 3, a fourth qubit 4, a fifth qubit 5, and a sixth qubit 6. The fifth qubit 5 and the sixth qubit 6 are a first ancilla qubit 116 and a control qubit respectively, and the other four qubits are data qubits 114. The measurement sequence 162 of FIG. 7 includes sixteen measurement timesteps in which a measurement and a corresponding Pauli update are performed.

When the measurement device 130 measures the stabilizer operator for the plaquette 112, the measurement device 130 may be configured to prepare the second ancilla qubit 126 (the sixth qubit 6 in the example of FIG. 7) to have a $|+\rangle$ state prior to performing the measurement. Alternatively, the measurement device may prepare the second ancilla qubit 126 to have a |−⟩ state. The measurement device 130 may be further configured to apply one or more respective CNOT gates 120 to the plaquette 112. The first ancilla qubit 116 may be used as the ancilla qubit of the CNOT gate 120 and may correspond to the fifth qubit 5 shown in FIG. 7. In addition, a data qubit 114 of the four data qubits 114 may be the target qubit of the CNOT gate 120. The second ancilla qubit 126 of the plaquette 112 may be used as the control qubit. In the example of FIG. 7, measuring the XXXX stabilizer operator includes applying four CNOT gates 120, each of which has a different one of the four data qubits 114 as the target qubit.

Subsequently to applying the one or more CNOT gates 120 to the plaquette 112, measuring the stabilizer operator may further include performing a second ancilla measurement at the second ancilla qubit 126. The second ancilla measurement performed at the second ancilla qubit 126 may be a measurement of a Pauli X operator when the XXXX stabilizer operator is measured or a Pauli Z operator when the ZZZZ stabilizer operator is measured. The final measurement result is obtained from the measurement of the sixth qubit 6, as indicated with a vertical line in the example of FIG. 7.

Figure 8:
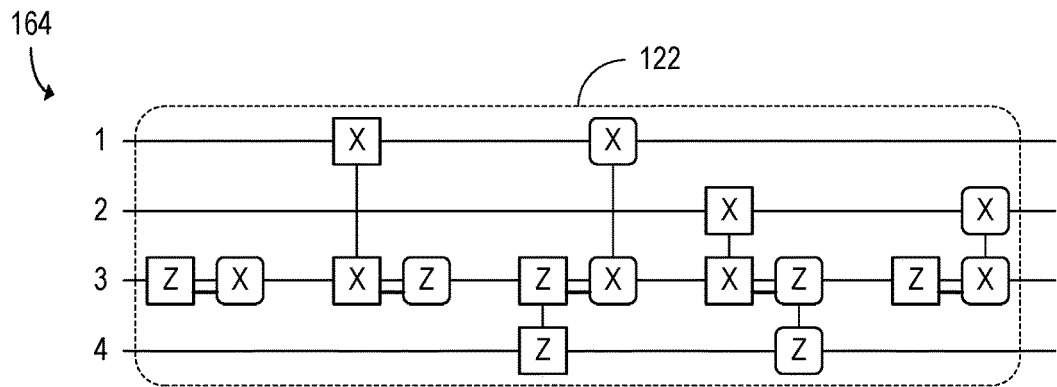
FIG. 8 shows a measurement sequence with which a two-target CNOT gate may be implemented, according to the embodiment of FIG. 2.

FIG. 8 shows a measurement sequence 164 with which a two-target CNOT gate 122 may be implemented. In the example of FIG. 8, the first qubit 1 and the second qubit 2 are target qubits, the third qubit 3 is an ancilla qubit, and the fourth qubit 4 is the control qubit.

Figure 9:
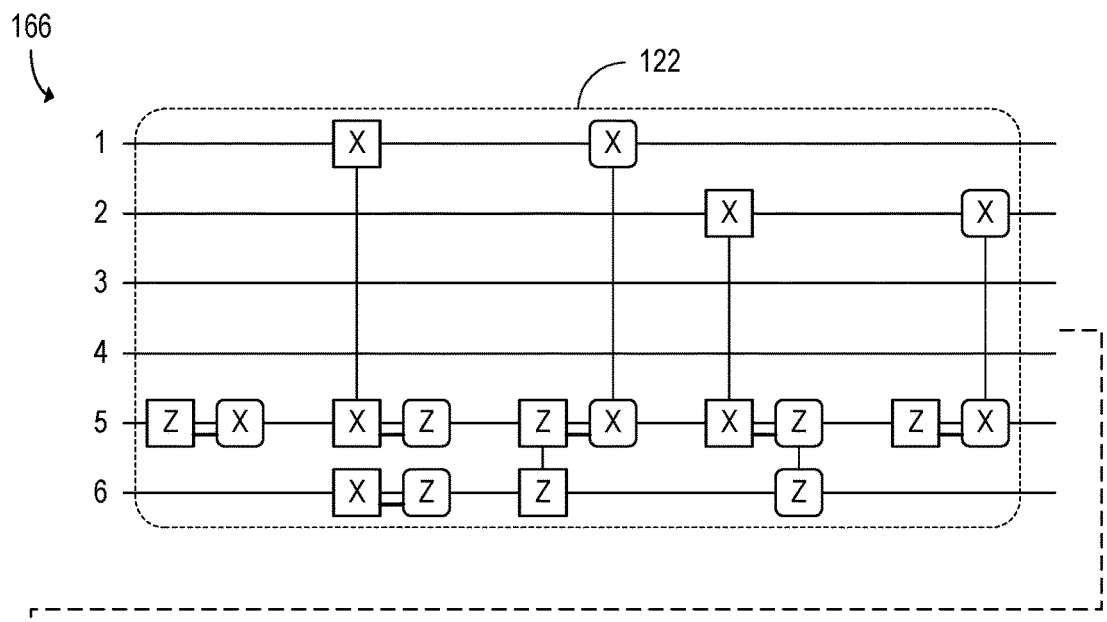
FIG. 9 shows another stabilizer operator measurement sequence that may be used to measure an XXXX stabilizer operator, according to the embodiment of FIG. 2.
Figure 9:
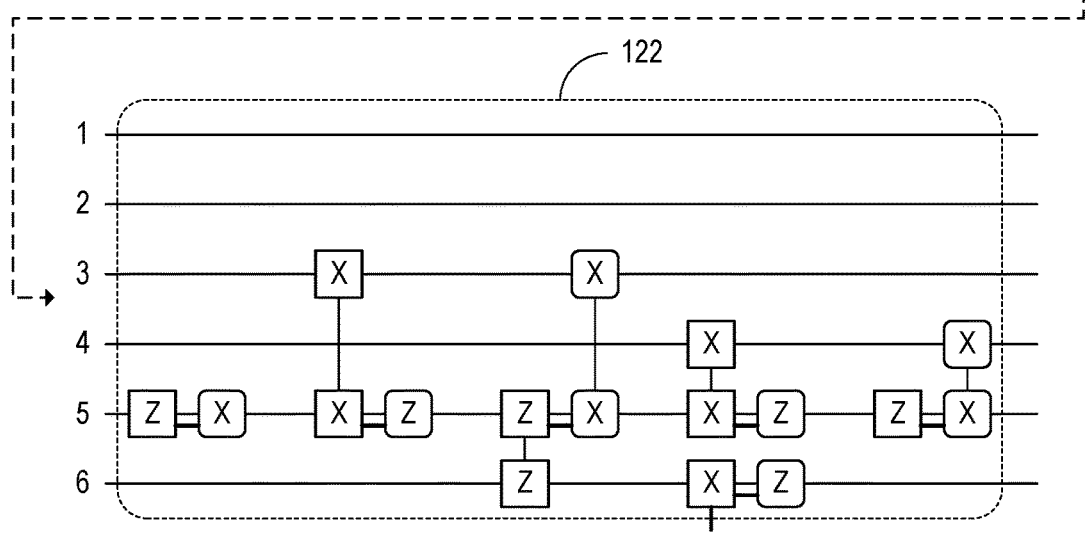

FIG. 9 shows another stabilizer operator measurement sequence 166 by which the measurement device 130 may be configured to measure the XXXX stabilizer operator. In the example of FIG. 9, CNOT gates 120 are implemented by applying two two-target CNOT gates 122 to the plaquette 112. The first two-target CNOT gate 122 included in the measurement sequence 166 of FIG. 9 has the first qubit 1 and the second qubit 2 as its target qubits. The second two-target CNOT gate 122 included in the measurement sequence 166 has the third qubit 3 and the fourth qubit 4 as its target qubits. The stabilizer operator measurement sequence 164 of FIG. 9 includes ten measurement timesteps rather than the sixteen measurement timesteps included in the measurement sequence 162 of FIG. 7. Thus, the measurement sequence 166 of FIG. 9 allows the XXXX stabilizer operator to be measured more quickly and with a lower error rate than the measurement sequence 162 of FIG. 7.

Figure 10:
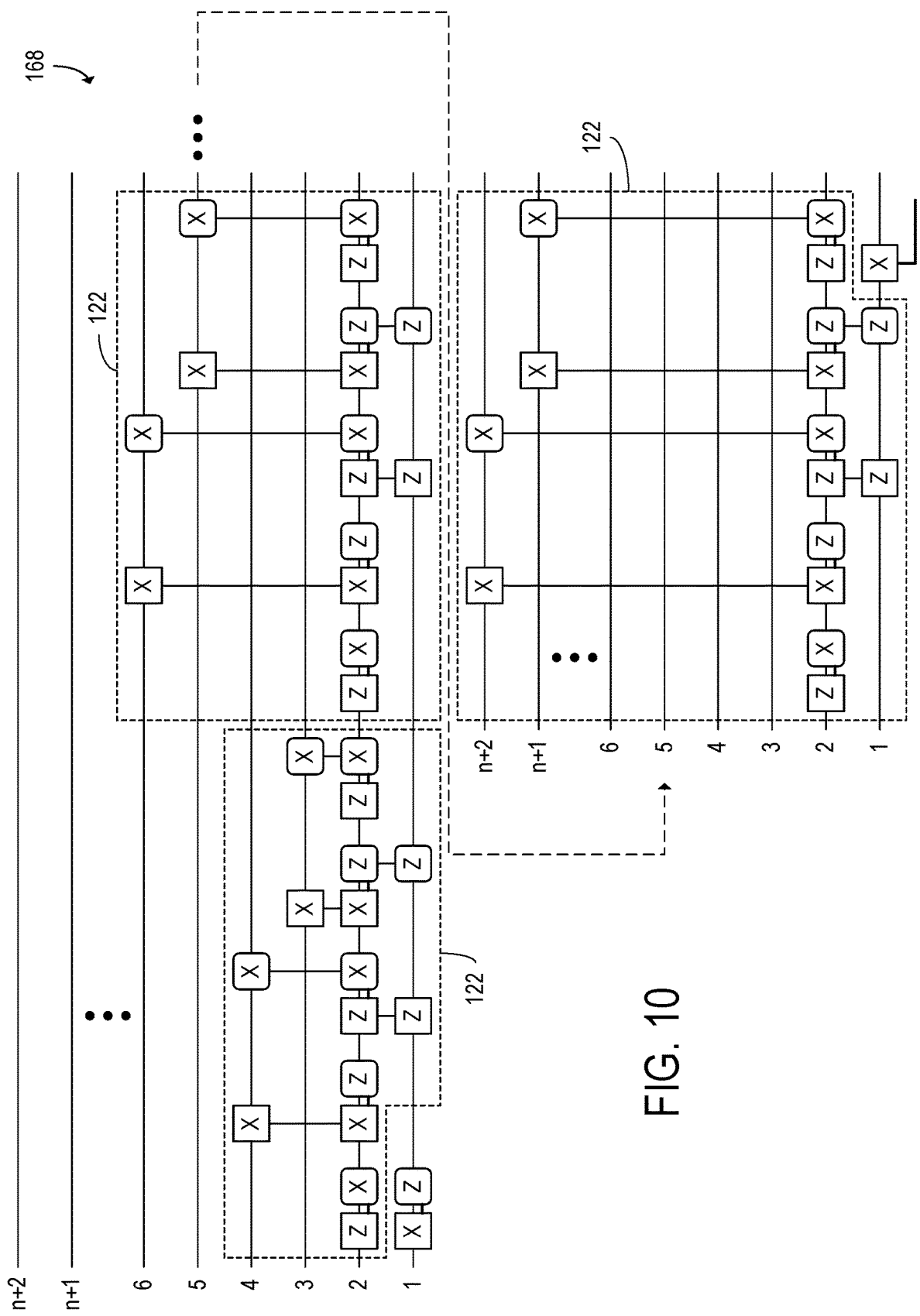
FIG. 10 shows a generalization of the stabilizer operator measurement sequence of FIG. 9.

FIG. 10 shows a stabilizer operator measurement sequence 168 that generalizes the XXXX stabilizer operator measurement sequence of FIG. 9 to plaquette architectures including any even number n≥2 of data qubits 114. In the measurement sequence 168 of FIG. 10, a two-target CNOT gate 122 is performed for each pair of target qubits that are adjacent in the numbering order such that each data qubit 114 is used as a target qubit in one two-target CNOT gate 122. The first qubit 1 and the second qubit 2 are the first ancilla qubit and the second ancilla qubit in the example of FIG. 10.

FIG. 11 shows an example measurement sequence 170 that may be used to measure a Pauli XXX operator 124. The Pauli XXX operator 124 may be used, for example, when measuring a stabilizer operator in the Pauli X basis for a plaquette that has an odd number n≥3 of data qubits 114, as shown in the example of FIG. 12. In the measurement sequence 172 shown in FIG. 12, a plurality of two-target CNOT gates 122 are measured, as in the measurement sequence 168 of FIG. 10. The first qubit 1 and the second qubit 2 are the first ancilla qubit 116 and the second ancilla qubit 126 in the example of FIG. 12. After measuring the two-target CNOT gates 122, the measurement device 130 may be further configured to measure the Pauli XXX operator 124 for qubits n, n+1, and n+2.

Thus, the measurement device 130 may measure respective stabilizer operators for the plaquettes 112 of the logical qubit encoding surface 110 in order to perform error detection at the decoder 150. These stabilizer operators may be measured for plaquettes including any number of measurement-based data qubits 114 greater than or equal to two. In addition, although FIGS. 6-12 show measurement sequences for measuring Pauli X operators, the measurement sequences of FIGS. 6-12 may be modified to measure Pauli Z operators instead. A measurement sequence in which a Pauli X operator is measured may be adapted to measure a Pauli Z operator by switching all Pauli X operators and Pauli Z operators in the measurement sequence, as well as switching all Pauli X updates and Pauli Z updates.

Figure 13:
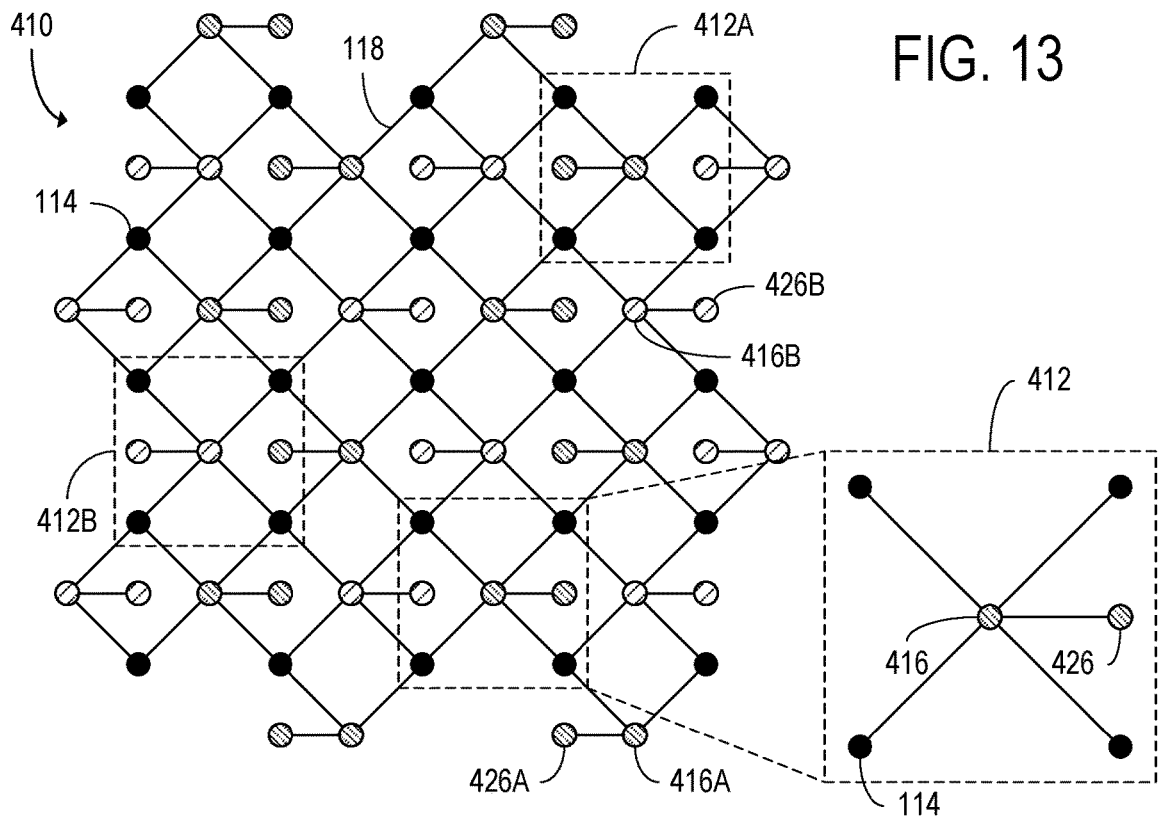
FIG. 13 shows another example configuration of a logical qubit encoding surface including a plurality of measurement-based qubits, including a 5×5 grid of data qubits.

FIG. 13 shows an alternative configuration of a logical qubit encoding surface 410, according to one example embodiment. The logical qubit encoding surface 410 of FIG. 13 includes a plurality of plaquettes 412. In the example of FIG. 13, the logical qubit encoding surface 410 includes sixteen plaquettes 412. Each plaquette 412 of the plurality of plaquettes 412 includes a plurality of measurement-based qubits. The plurality of measurement-based qubits in each plaquette 412 includes four data qubits 114, a first ancilla qubit 416, and a second ancilla qubit 426. In FIG. 13, similarly to in FIG. 2, the respective data qubits 114 included in the plurality of plaquettes 412 are arranged in a 5×5 rectangular grid. In addition, the four data qubits 114 of each plaquette 412 are arranged in a square.

In each plaquette 412 of the logical qubit encoding surface 410 of FIG. 13, the first ancilla qubit 416 is electrically connected to the four data qubits 114 and the second ancilla qubit 426. However, each second ancilla qubit 426 is not electrically connected to any measurement-based qubits other than the first ancilla qubit 416. Since each ancilla qubit included in the logical qubit encoding surface 410 of FIG. 13 is only used by one plaquette 412, the total number of ancilla qubits increases to 48 compared to the 24 ancilla qubits included in the logical qubit encoding surface 110 of FIG. 2. Although the total number of ancilla qubits is higher in the embodiment of FIG. 13 than in the embodiment of FIG. 2, the connectivity degree of each qubit (the total number of other qubits to which that qubit is electrically connected) is at most four rather than five. This decrease in the maximum connectivity degree may reduce the amount of time elapsed per measurement cycle by a factor of two.

The logical qubit encoding surface 410 of FIG. 13 may be included in a quantum computing device 100, which may include a measurement device 130 and a classical computing device 140. Similarly to the logical qubit encoding surface 110 of FIG. 2, the logical qubit encoding surface 410 of FIG. 13 alternates between a first set of plaquettes 412A for which the measurement device 130 is configured to measure an XXXX stabilizer operator and a second set of plaquettes 412B for which the measurement device 130 is configured to measure a ZZZZ stabilizer operator. Each plaquette 412A of the first set of plaquettes 412A may include a first XXXX ancilla qubit 416A and a second XXXX ancilla qubit 426A. In addition, each plaquette 412B of the second set of plaquettes 412B may include a first ZZZZ ancilla qubit 416B and a second ZZZZ ancilla qubit 426B.

Figure 14:
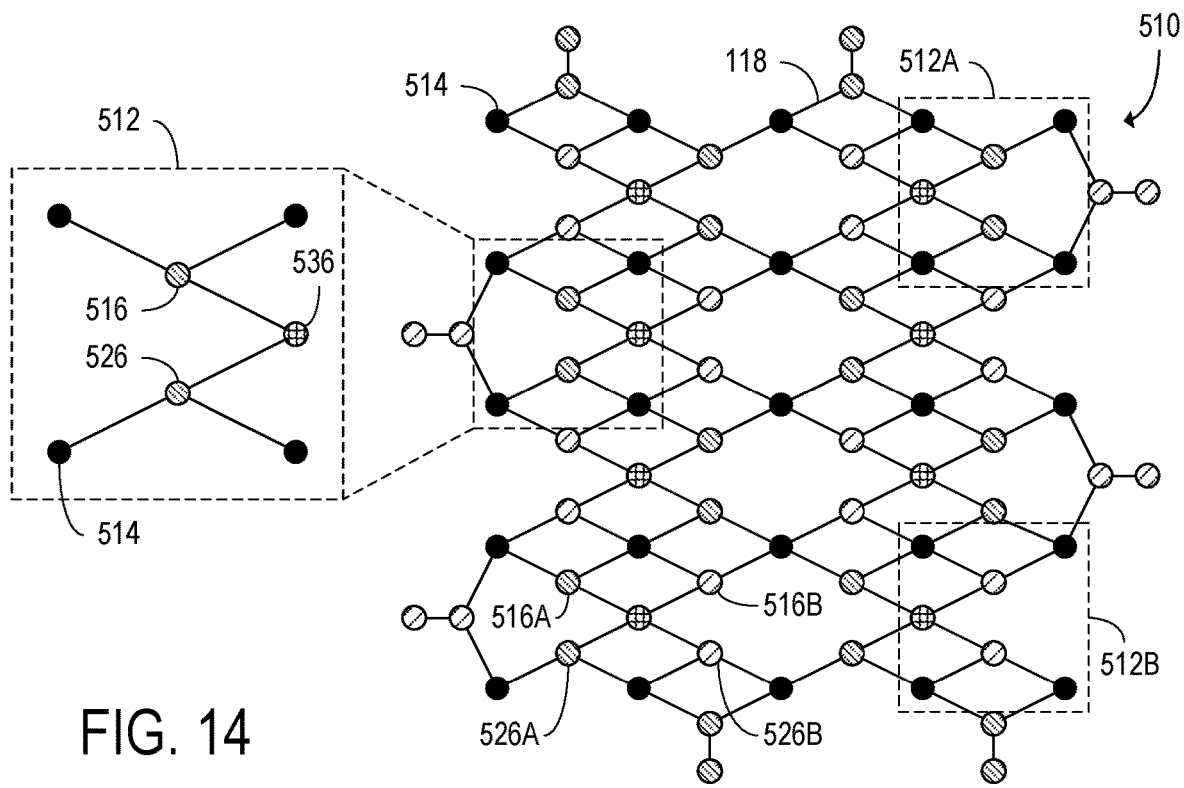
FIG. 14 shows another example configuration of a logical qubit encoding surface including a plurality of measurement-based qubits, including a 5×5 grid of data qubits.

A logical qubit encoding surface 510 is shown in FIG. 14 according to another example embodiment. In the embodiment of FIG. 14, each plaquette 512 includes four data qubits 514 arranged in a square. Each plaquette 512 further includes a first ancilla qubit 516, a second ancilla qubit 526, and a third ancilla qubit 536. The first ancilla qubit 516 and the second ancilla qubit 526 are each electrically connected to two of the data qubits 514 and to the third ancilla qubit 536. Each data qubit 514 and each third ancilla qubit 536 of each plaquette 512 shown in FIG. 14 is connected to two first ancilla qubits 516 and two second ancilla qubits 526.

The logical qubit encoding surface 510 of FIG. 14 may be included in a quantum computing device 100, which may include a measurement device 130 and a classical computing device 140. In addition, the logical qubit encoding surface 510 may include a first set of plaquettes 512A at which the measurement device 130 may be configured to measure an XXXX stabilizer operator and a second set of plaquettes 512B at which the measurement device 130 may be configured to measure a ZZZZ stabilizer operator. Each plaquette 512A of the first set of plaquettes 512A may include a first XXXX ancilla qubit 516A and a second XXXX ancilla qubit 526A. In addition, each plaquette 512B of the second set of plaquettes 512B may include a first ZZZZ ancilla qubit 516B and a second ZZZZ ancilla qubit 526B.

Figure 15A:
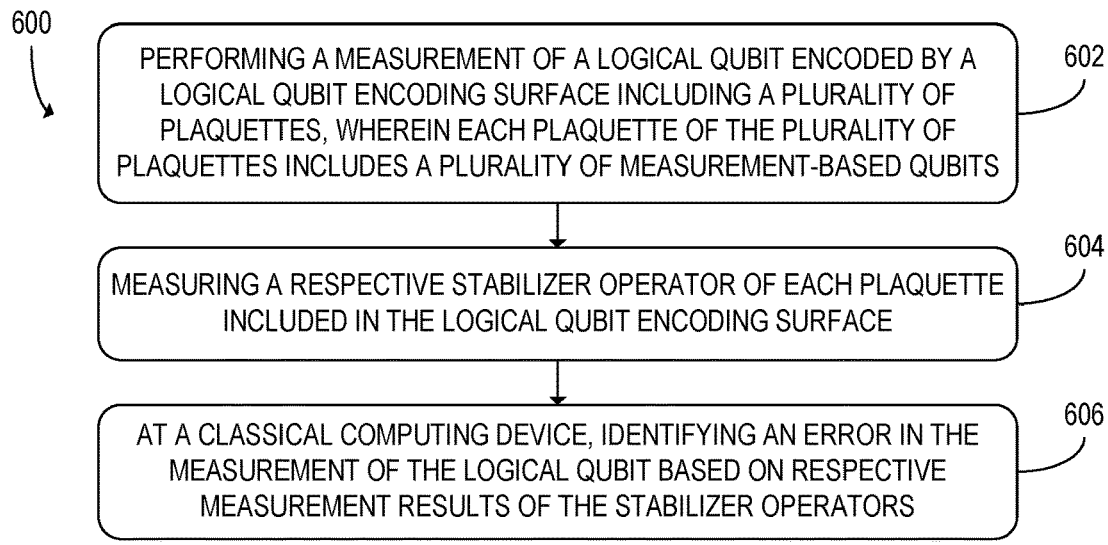
FIG. 15A shows a flowchart of an example method for performing a measurement of a logical qubit with a quantum computing device.

FIG. 15A shows a flowchart of an example method 600 for use with a quantum computing device. For example, the method 600 may be used with the quantum computing device 100 of FIG. 5 or with a quantum computing device having some other configuration. At step 602, the method 600 may include performing a measurement of a logical qubit encoded by a logical qubit encoding surface including a plurality of plaquettes. The measurement may be performed using a measurement device included in the quantum computing device. Each plaquette of the plurality of plaquettes may include a plurality of measurement-based qubits. In some embodiments, the plurality of measurement-based qubits included in each plaquette includes four data qubits and a first ancilla qubit. The data qubits included in the logical qubit encoding surface may be arranged in a rectangular grid. The four data qubits may be arranged in a square, and the first ancilla qubit may be located within the square. In such embodiments, the first ancilla qubit may be electrically connected to the four data qubits and a second ancilla qubit included in the logical qubit encoding surface. The second ancilla qubit may be located inside or outside the plaquette.

At step 604, the method 600 may further include measuring a respective stabilizer operator of each plaquette included in the logical qubit encoding surface. Each stabilizer operator may include a product of four Pauli X operators or four Pauli Z operators.

At step 606, the method 600 may further include identifying an error in the measurement of the logical qubit based on respective measurement results of the stabilizer operators. The error in the measurement may be identified at a classical computing device communicatively coupled to the measurement device. A decoding algorithm such as the union-find decoding algorithm may be executed at the classical computing device to detect the error.

Figure 15B:
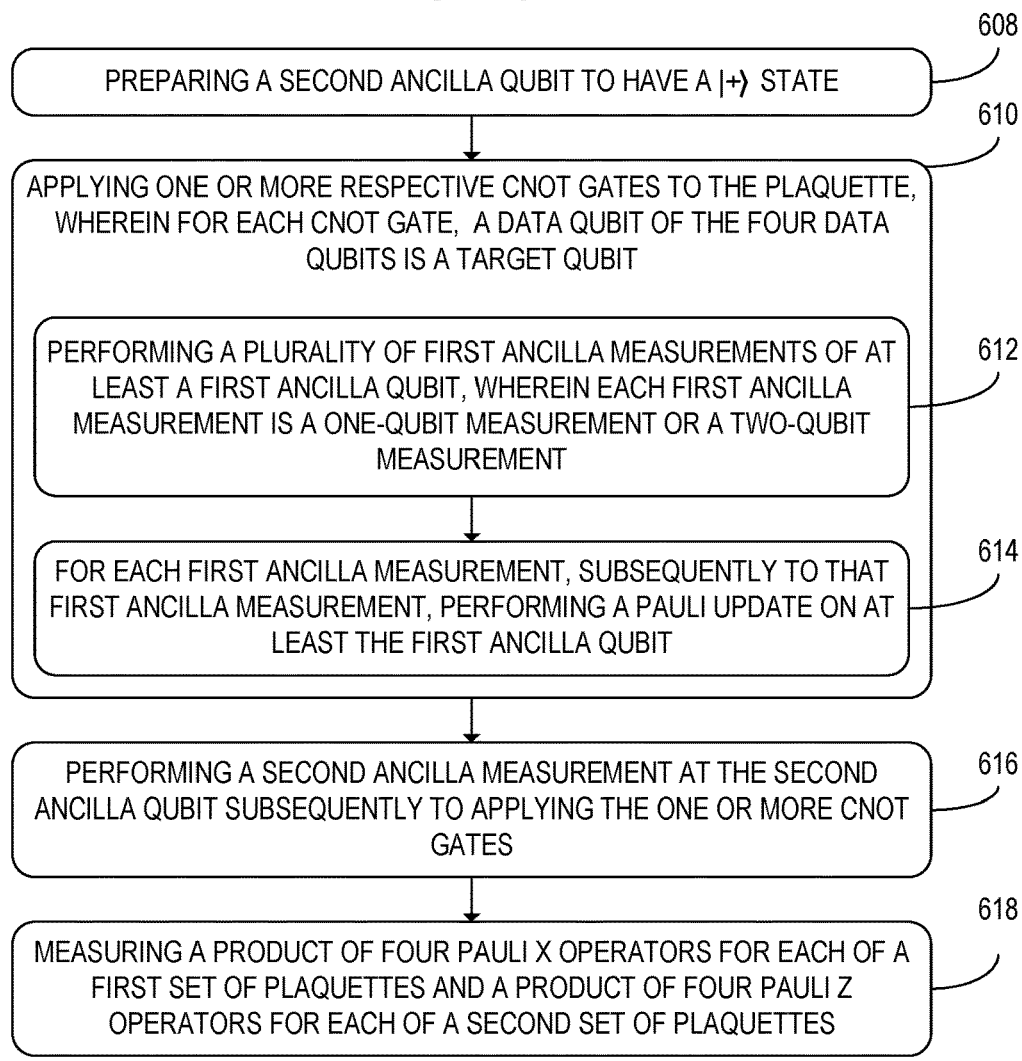
FIG. 15B shows additional steps of the method of FIG. 15A that may be performed when measuring a stabilizer operator.

FIG. 15B shows additional steps of the method 600 that may be performed in some embodiments when measuring the stabilizer operator for a plaquette. At step 608, the method 600 may further include preparing the second ancilla qubit to have a $|+\rangle$ state. In other embodiments, the second ancilla qubit may be prepared to have a $|-\rangle$ state. At step 610, the method 600 may further include applying one or more respective CNOT gates to the plaquette. For each CNOT gate, a data qubit of the four data qubits may be a target qubit. The first ancilla qubit of the plaquette may be the ancilla qubit of the CNOT gate. The second ancilla qubit connected to the plaquette may be the control qubit of the CNOT gate.

Applying the CNOT gate may include, at step 612, performing a plurality of first ancilla measurements of at least the first ancilla qubit. Each first ancilla measurement may be a one-qubit measurement or a two-qubit measurement. At step 614, applying the CNOT gate may further include, for each first ancilla measurement, performing a Pauli update on at least the first ancilla qubit. The Pauli update may include applying a Pauli X operator or a Pauli Z operator to the first ancilla qubit. Each Pauli update may be performed subsequently to its corresponding first ancilla measurement. In some embodiments, the Pauli update following a first ancilla measurement may be performed under the condition that the first ancilla measurement has a measurement outcome of $|-\rangle$.

The method 600 may further include, at step 616, performing a second ancilla measurement at the second ancilla qubit subsequently to applying the one or more CNOT gates. The second ancilla qubit may be used as a control qubit in such embodiments. In some embodiments, the second ancilla measurement may be a measurement of a Pauli X operator or a Pauli Z operator. The second ancilla measurement may return the value of the stabilizer operator for the plaquette.

In some embodiments, the method 600 may further include, at step 618, measuring a product of four Pauli X operators for each of a first set of plaquettes and a product of four Pauli Z operators for each of a second set of plaquettes included in the logical qubit encoding surface. In such embodiments, the plurality of plaquettes may be arranged in a rectangular grid. The rectangular grid may include a first plurality of respective grid positions of the first set of plaquettes that alternate with a second plurality of respective grid positions of the second set of plaquettes.

Figure 16:
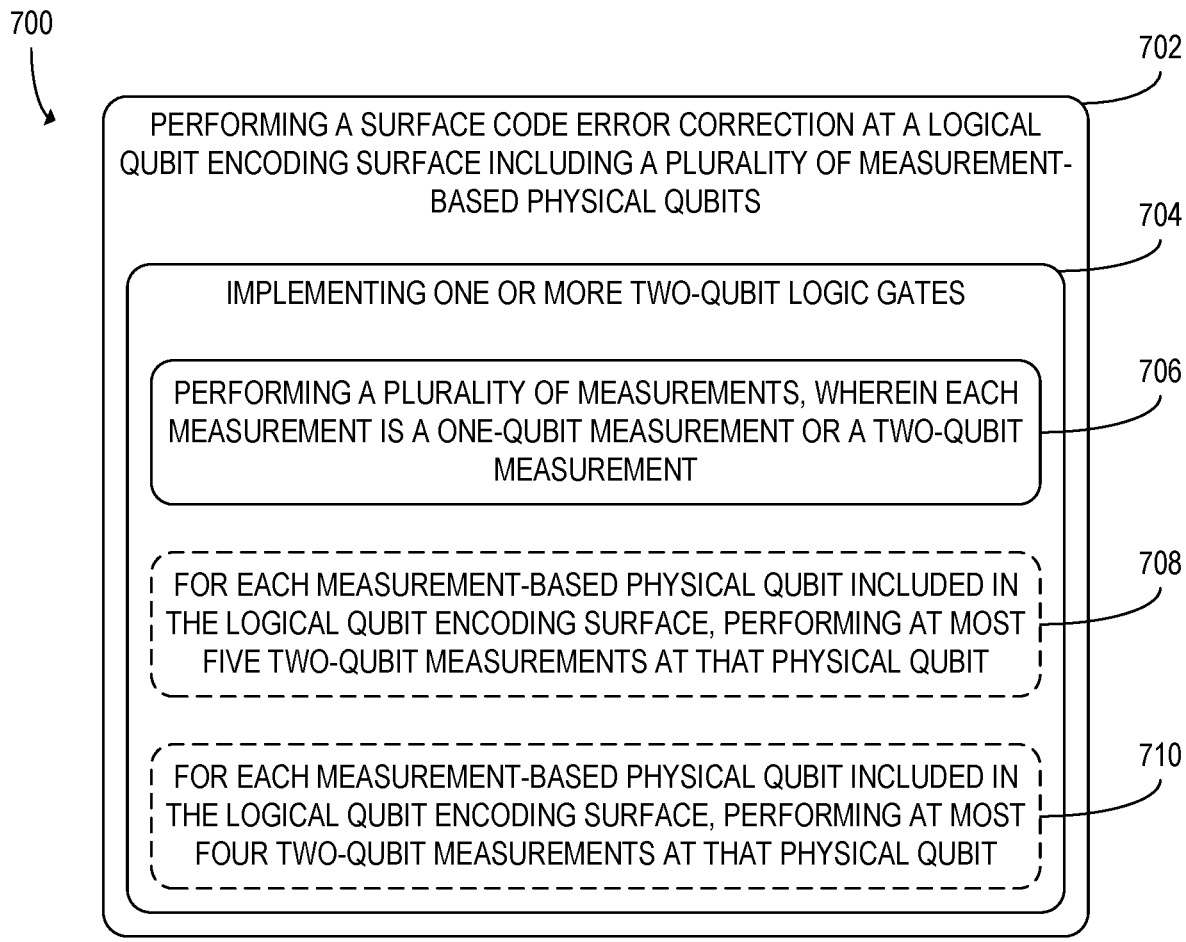
FIG. 16 shows a flowchart of an example method for performing a surface code error correction at a quantum computing device.

FIG. 16 shows a flowchart of another example method 700 that may be performed with a quantum computing device. The quantum computing device at which the method 700 is performed may be the quantum computing device 100 of FIG. 5. The method 700 may be performed additionally or alternatively to the method 600 of FIG. 15A. At step 702, the method 700 may include performing a surface code error correction at a logical qubit encoding surface including a plurality of measurement-based physical qubits. In embodiments in which the method 700 is performed in addition to the method 600 of FIG. 15A, the surface code error correction may be performed subsequently to identifying an error in the measurement of the logical qubit at step 606.

At step 704, the method 700 may include implementing one or more two-qubit logic gates. For example, the one or more two-qubit logic gates may include one or more two-qubit Pauli gates. In addition the one or more two-qubit logic gates, performing surface error code correction may further include implementing one or more one-qubit logic gates.

At step 706, implementing the one or more two-qubit logic gates may include performing a plurality of measurements. Each measurement of the plurality of measurements may be a one-qubit measurement or a two-qubit measurement. Thus, each of the one or more two-qubit logic gates may be implemented without having to perform a measurement of three or more qubits. In some embodiments, for each measurement-based physical qubit included in the logical qubit encoding surface, performing the surface code error correction may include performing at most five two-qubit measurements at that physical qubit, as shown at step 708. Additionally, for each measurement-based physical qubit included in the logical qubit encoding surface, performing the surface code error correction may include performing at most four two-qubit measurements at that physical qubit, as shown at step 710.

The devices and methods described above allow surface codes to be used for error correction at logical qubit encoding surfaces constructed with measurement-based qubits. Previously, surface codes were only usable with CNOT-based qubits. In addition, the devices and methods described above allow surface-code-compatible logical qubit encoding surfaces to be constructed with small numbers of physical qubits and low connectivity degrees between qubits. Thus, the above devices and methods allow quantum computations to be performed with low error rates and efficient error correction.

In some embodiments, the methods and processes described herein may be tied to a computing system of one or more computing devices. In particular, such methods and processes may be implemented as a computer-application program or service, an application-programming interface (API), a library, and/or other computer-program product.

Figure 17:
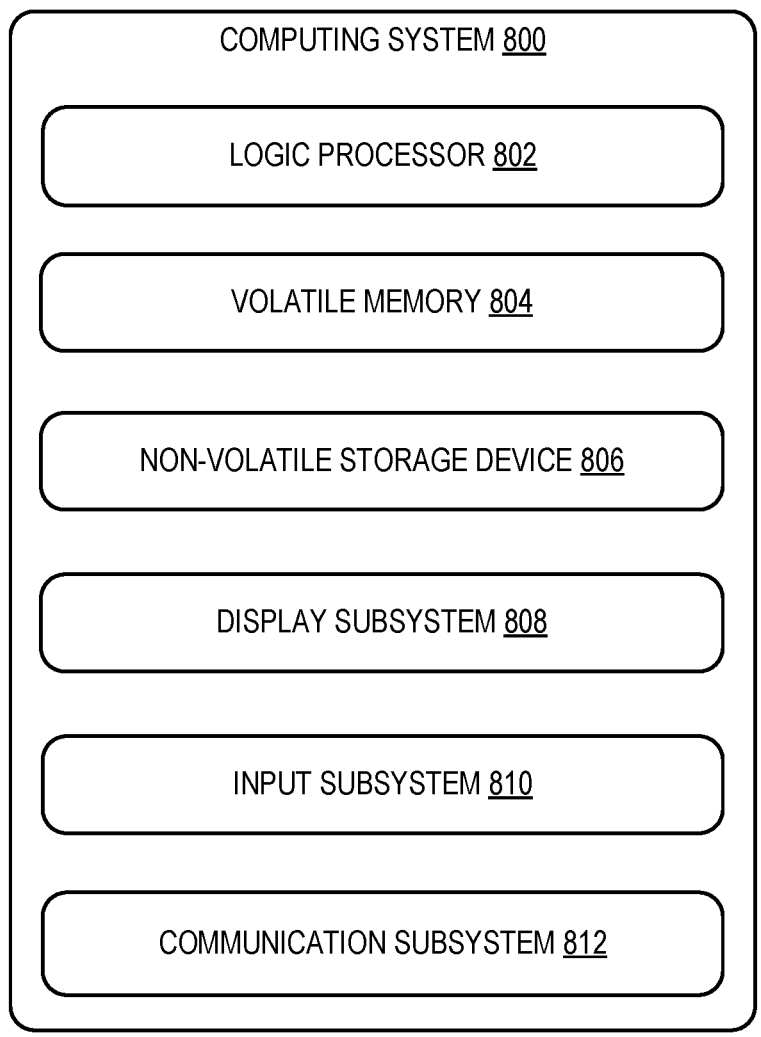
FIG. 17 shows a schematic view of an example computing environment in which the quantum computing device of FIG. 5 may be enacted.

FIG. 17 schematically shows a non-limiting embodiment of a computing system 800 that can enact one or more of the methods and processes described above. Computing system 800 is shown in simplified form. Computing system 800 may be included in the quantum computing device 100 described above and illustrated in FIG. 5. Computing system 800 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 800 includes a logic processor 802 volatile memory 804, and a non-volatile storage device 806. Computing system 800 may optionally include a display subsystem 808, input subsystem 810, communication subsystem 812, and/or other components not shown in FIG. 17.

Logic processor 802 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 802 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 806 includes one or more physical devices configured to hold instructions executable by the logic processors to implement the methods and processes described herein. When such methods and processes are implemented, the state of non-volatile storage device 806 may be transformed—e.g., to hold different data.

Non-volatile storage device 806 may include physical devices that are removable and/or built-in. Non-volatile storage device 806 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 806 may include nonvolatile, dynamic, static, read/write, read-only, sequential-access, location-addressable, file-addressable, and/or content-addressable devices. It will be appreciated that non-volatile storage device 806 is configured to hold instructions even when power is cut to the non-volatile storage device 806.

Volatile memory 804 may include physical devices that include random access memory. Volatile memory 804 is typically utilized by logic processor 802 to temporarily store information during processing of software instructions. It will be appreciated that volatile memory 804 typically does not continue to store instructions when power is cut to the volatile memory 804.

Aspects of logic processor 802, volatile memory 804, and non-volatile storage device 806 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 800 typically implemented in software by a processor to perform a particular function using portions of volatile memory, which function involves transformative processing that specially configures the processor to perform the function. Thus, a module, program, or engine may be instantiated via logic processor 802 executing instructions held by non-volatile storage device 806, using portions of volatile memory 804. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 808 may be used to present a visual representation of data held by non-volatile storage device 806. The visual representation may take the form of a graphical user interface (GUI). As the herein described methods and processes change the data held by the non-volatile storage device, and thus transform the state of the non-volatile storage device, the state of display subsystem 808 may likewise be transformed to visually represent changes in the underlying data. Display subsystem 808 may include one or more display devices utilizing virtually any type of technology. Such display devices may be combined with logic processor 802, volatile memory 804, and/or non-volatile storage device 806 in a shared enclosure, or such display devices may be peripheral display devices.

When included, input subsystem 810 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 812 may be configured to communicatively couple various computing devices described herein with each other, and with other devices. Communication subsystem 812 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 800 to send and/or receive messages to and/or from other devices via a network such as the Internet.

According to one aspect of the present disclosure, a quantum computing device is provided, including a logical qubit encoding surface including a plurality of plaquettes. Each plaquette of the plurality of plaquettes may include a plurality of measurement-based qubits. The plurality of measurement-based qubits may include four data qubits and a first ancilla qubit. The first ancilla qubit may be electrically connected to the four data qubits and a second ancilla qubit included in the logical qubit encoding surface.

According to this aspect, the four data qubits of the plaquette may be arranged in a square.

According to this aspect, the first ancilla qubit may be located within the square.

According to this aspect, the respective data qubits included in the plurality of plaquettes may be arranged in a rectangular grid.

According to this aspect, for each plaquette of the plurality of plaquettes, an electrical connection between the first ancilla qubit and the second ancilla qubit may extend in a direction perpendicular to an edge of the rectangular grid that is closest to a midpoint between the first ancilla qubit and the second ancilla qubit.

According to this aspect, the quantum computing device may further include a measurement device configured to perform a measurement of a logical qubit encoded by the logical qubit encoding surface. The measurement device may be further configured to measure a respective stabilizer operator of each plaquette included in the logical qubit encoding surface. The quantum computing device may further include a classical computing device configured to identify an error in the measurement of the logical qubit based on respective measurement results of the stabilizer operators.

According to this aspect, each stabilizer operator may be a product of four Pauli X operators or four Pauli Z operators of the four respective data qubits included in the plaquette.

According to this aspect, the measurement device may be configured to measure the product of the four Pauli X operators for each of a first set of plaquettes and the product of the four Pauli Z operators for each of a second set of plaquettes. The plurality of plaquettes may be arranged in a rectangular grid including a first plurality of respective grid positions of the first set of plaquettes that alternate with a second plurality of respective grid positions of the second set of plaquettes.

According to this aspect, for each plaquette, the measurement device may be configured to measure the respective stabilizer operator of the plaquette at least in part by preparing the second ancilla qubit to have a $|+\rangle$ state. Measuring the stabilizer operator may further include applying one or more respective controlled not (CNOT) gates to the plaquette. For each CNOT gate, a data qubit of the four data qubits is a target qubit. Measuring the stabilizer operator may further include performing a second ancilla measurement at the second ancilla qubit subsequently to applying the one or more CNOT gates.

According to this aspect, the second ancilla measurement may be a measurement of a Pauli X operator or a Pauli Z operator.

According to this aspect, applying each CNOT gate may include performing a plurality of first ancilla measurements of at least the first ancilla qubit. Each first ancilla measurement may be a one-qubit measurement or a two-qubit measurement. Applying the CNOT gate may further include, for each first ancilla measurement, subsequently to that first ancilla measurement, performing a Pauli update on at least the second first qubit.

According to another aspect of the present disclosure, a method for use with a quantum computing device is provided. The method may include, at a measurement device, performing a measurement of a logical qubit encoded by a logical qubit encoding surface including a plurality of plaquettes. Each plaquette of the plurality of plaquettes may include a plurality of measurement-based qubits. The method may further include measuring a respective stabilizer operator of each plaquette included in the logical qubit encoding surface. The method may further include, at a classical computing device, identifying an error in the measurement of the logical qubit based on respective measurement results of the stabilizer operators.

According to this aspect, each plaquette may include a first ancilla qubit and may be electrically connected to a second ancilla qubit. Measuring the stabilizer operator may include preparing the second ancilla qubit to have a $|+\rangle$ state. Measuring the stabilizer operator may further include applying one or more respective controlled not (CNOT) gates to the plaquette, wherein for each CNOT gate, a data qubit of the four data qubits is a target qubit. Measuring the stabilizer operator may further include performing a second ancilla measurement at the second ancilla qubit subsequently to applying the one or more CNOT gates.

According to this aspect, the second ancilla measurement may be a measurement of a Pauli X operator or a Pauli Z operator.

According to this aspect, applying each CNOT gate may include performing a plurality of first ancilla measurements of at least the first ancilla qubit. Each first ancilla measurement may be a one-qubit measurement or a two-qubit measurement. For each first ancilla measurement, subsequently to that first ancilla measurement, applying the CNOT gate may further include performing a Pauli update on at least the first ancilla qubit.

According to this aspect, the plurality of measurement-based qubits included in each plaquette may include four data qubits and a first ancilla qubit. The first ancilla qubit may be electrically connected to the four data qubits and a second ancilla qubit included in the logical qubit encoding surface.

According to this aspect, the stabilizer operator may include a product of four Pauli X operators or four Pauli Z operators.

According to another aspect of the present disclosure, a method for use with a quantum computing device is provided. The method may include performing a surface code error correction at a logical qubit encoding surface including a plurality of measurement-based physical qubits. Performing the surface code error correction may include implementing one or more two-qubit logic gates. Implementing each two-qubit logic gate may include performing a plurality of measurements. Each measurement may be a one-qubit measurement or a two-qubit measurement.

According to this aspect, for each measurement-based physical qubit included in the logical qubit encoding surface, performing the surface code error correction may include performing at most five two-qubit measurements at that physical qubit.

According to this aspect, for each measurement-based physical qubit included in the logical qubit encoding surface, performing the surface code error correction may include performing at most four two-qubit measurements at that physical qubit.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A quantum computing device comprising:
   a logical qubit encoding surface including a plurality of plaquettes, wherein:
      each plaquette of the plurality of plaquettes includes a plurality of measurement-based qubits;
      the plurality of measurement-based qubits includes four data qubits, a first ancilla qubit, and a second ancilla qubit; and
      the first ancilla qubit is electrically connected, via separate corresponding electrical connections, to the four data qubits and the second ancilla qubit.

2. The quantum computing device of claim 1, wherein the four data qubits of the plaquette are arranged in a square.

3. The quantum computing device of claim 2, wherein the first ancilla qubit is located within the square.

4. The quantum computing device of claim 2, wherein the respective data qubits included in the plurality of plaquettes are arranged in a rectangular grid.

5. The quantum computing device of claim 1, wherein the second ancilla qubit is not directly electrically connected to the four data qubits.

6. The quantum computing device of claim 1, wherein the electrical connection between the first ancilla qubit and the second ancilla qubit connects the first ancilla qubit to the second ancilla qubit via a third ancilla qubit.

7. The quantum computing device of claim 6, wherein the third ancilla qubit is not directly electrically connected to the four data qubits.

8. The quantum computing device of claim 1, further comprising:
   a measurement device configured to:
      perform a measurement of a logical qubit encoded by the logical qubit encoding surface; and
      measure a respective stabilizer operator of each plaquette included in the logical qubit encoding surface; and
   a classical computing device configured to identify an error in the measurement of the logical qubit based on respective measurement results of the stabilizer operators.

9. The quantum computing device of claim 8, wherein each stabilizer operator is a product of four Pauli X operators or four Pauli Z operators of the four respective data qubits included in the plaquette.

10. The quantum computing device of claim 9, wherein:
    the measurement device is configured to measure the product of the four Pauli X operators for each of a first set of plaquettes and the product of the four Pauli Z operators for each of a second set of plaquettes; and
    the plurality of plaquettes are arranged in a rectangular grid including a first plurality of respective grid positions of the first set of plaquettes that alternate with a second plurality of respective grid positions of the second set of plaquettes.

11. The quantum computing device of claim 8, wherein, for each plaquette, the measurement device is configured to measure the respective stabilizer operator of the plaquette at least in part by:
    preparing the second ancilla qubit to have a |+⟩ state;
    applying one or more respective controlled not (CNOT) gates to the plaquette, wherein for each CNOT gate, a data qubit of the four data qubits is a target qubit; and
    performing a second ancilla measurement at the second ancilla qubit subsequently to applying the one or more CNOT gates.

12. The quantum computing device of claim 11, wherein the second ancilla measurement is a measurement of a Pauli X operator or a Pauli Z operator.

13. The quantum computing device of claim 11, wherein applying each CNOT gate includes:
    performing a plurality of first ancilla measurements of at least the first ancilla qubit, wherein each first ancilla measurement is a one-qubit measurement or a two-qubit measurement; and
    for each first ancilla measurement, subsequently to that first ancilla measurement, performing a Pauli update on at least the first ancilla qubit.

14. A method for use with a quantum computing device, the method comprising:
    at a measurement device:
       performing a measurement of a logical qubit encoded by a logical qubit encoding surface including a plurality of plaquettes, wherein:
          each plaquette of the plurality of plaquettes includes a plurality of measurement-based qubits;
          the plurality of measurement-based qubits includes four data qubits, a first ancilla qubit, and a second ancilla qubit;

the first ancilla qubit is electrically connected, via separate corresponding electrical connections, to the four data qubits and the second ancilla qubit; and measuring a respective stabilizer operator of each plaquette included in the logical qubit encoding surface; and at a classical computing device, identifying an error in the measurement of the logical qubit based on respective measurement results of the stabilizer operators.

15. The method of claim 14, wherein measuring the stabilizer operator includes:

preparing the second ancilla qubit to have a $|+\rangle$ state;

applying one or more respective controlled not (CNOT) gates to the plaquette, wherein for each CNOT gate, a data qubit of the four data qubits is a target qubit; and performing a second ancilla measurement at the second ancilla qubit subsequently to applying the one or more CNOT gates.

16. The method of claim 15, wherein the second ancilla measurement is a measurement of a Pauli X operator or a Pauli Z operator.

17. The method of claim 15, wherein applying each CNOT gate includes:

performing a plurality of first ancilla measurements of at least the first ancilla qubit, wherein each first ancilla measurement is a one-qubit measurement or a two-qubit measurement; and for each first ancilla measurement, subsequently to that first ancilla measurement, performing a Pauli update on at least the first ancilla qubit.

18. The method of claim 14, wherein the stabilizer operator includes a product of four Pauli X operators or four Pauli Z operators.

19. A method for use with a quantum computing device, the method comprising:

performing a surface code error correction at a logical qubit encoding surface, wherein:

the logical qubit encoding surface includes a plurality of plaquettes that each include a plurality of measurement-based physical qubits;

the plurality of measurement-based physical qubits included in each plaquette include four data qubits, a first ancilla qubit, and a second ancilla qubit;

the first ancilla qubit is electrically connected, via separate corresponding electrical connections, to the four data qubits and the second ancilla qubit;

performing the surface code error correction includes implementing one or more two-qubit logic gates; and implementing each two-qubit logic gate includes performing a plurality of measurements, wherein each measurement is a one-qubit measurement or a two-qubit measurement.

20. The method of claim 19, wherein the electrical connection between the first ancilla qubit and the second ancilla qubit connects the first ancilla qubit to the second ancilla qubit via a third ancilla qubit.

\* \* \* \* \*